(12) United States Patent
Hong et al.

(10) Patent No.: US 11,462,529 B2
(45) Date of Patent: Oct. 4, 2022

(54) ELECTRONIC APPARATUS

(71) Applicant: Samsung Display Co., Ltd., Yongin-si (KR)

(72) Inventors: Jungpyo Hong, Hwaseong-si (KR); Jongwoo Park, Seongnam-si (KR); Changwoo Byun, Hwaseong-si (KR); Younjae Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 17/196,908

(22) Filed: Mar. 9, 2021

(65) Prior Publication Data

US 2021/0366891 A1 Nov. 25, 2021

(30) Foreign Application Priority Data

May 22, 2020 (KR) .................. 10-2020-0061691

(51) Int. Cl.
*H01L 25/18* (2006.01)
*H01L 27/32* (2006.01)
(Continued)

(52) U.S. Cl.
CPC .......... *H01L 25/18* (2013.01); *H01L 27/3276* (2013.01); *H05K 1/0274* (2013.01);
(Continued)

(58) Field of Classification Search
CPC ..... H01L 24/32; H01L 27/3276; H01L 25/18; H05K 1/181; H05K 1/113; H05K 1/0274
USPC ........................................................ 361/768
See application file for complete search history.

(56) References Cited

U.S. PATENT DOCUMENTS 10,170,711 B2   1/2019   Sauers et al.
10,580,846 B2   3/2020   Seo et al.
(Continued)

FOREIGN PATENT DOCUMENTS

CN        106973520       7/2017
KR     10-2018-0041301    4/2018
(Continued)

OTHER PUBLICATIONS

Kanehiro, et al., Development of Sumitomo Electric's Flexible Printed Circuit Business, SEI Technical Review, Apr. 2008, pp. 4-13, No. 66, Sumitomo Electric Industries, Ltd., Osaka, Japan.

*Primary Examiner* — Tremesha S Willis
(74) *Attorney, Agent, or Firm* — H.C. Park & Associates, PLC

(57) ABSTRACT

An electronic apparatus including a display module having a front surface and a rear surface opposing the front surface and including pixels disposed on the front surface and a display pad connected to the pixels and exposed from the rear surface, a protective film disposed on the rear surface of the display module, a circuit board disposed between the display module and the protective film and having a front surface facing the rear surface of the display module and a rear surface, the circuit board including a first substrate pad connected to the display pad and exposed from the front surface of the circuit board and a second substrate pad exposed from the rear surface of the circuit board, and a driving element connected to the second substrate pad to drive the pixels, in which the second substrate pad and the protective film are spaced apart from each other.

24 Claims, 13 Drawing Sheets

(51) Int. Cl.
  H05K 1/02 (2006.01)
  H05K 1/11 (2006.01)
  H05K 1/18 (2006.01)
  *H01L 23/00* (2006.01)
  *H01L 51/00* (2006.01)
(52) U.S. Cl.
  CPC ............. H05K 1/113 (2013.01); H05K 1/181 (2013.01); *H01L 24/32* (2013.01); *H01L 24/33* (2013.01); *H01L 51/0096* (2013.01); *H01L 2224/32225* (2013.01); *H01L 2224/32227* (2013.01); *H01L 2224/3303* (2013.01); *H01L 2224/33505* (2013.01); *H05K 2201/0145* (2013.01); *H05K 2201/0154* (2013.01); *H05K 2201/09672* (2013.01); *H05K 2201/10128* (2013.01); *H05K 2201/10545* (2013.01); *H05K 2201/2009* (2013.01)

(56) References Cited

U.S. PATENT DOCUMENTS

| | | | |
|---|---|---|---|
| 10,617,005 | B2 | 4/2020 | Lee |
| 10,993,330 | B2 | 4/2021 | Dong et al. |
| 2006/0016618 | A1 | 1/2006 | Kim et al. |
| 2018/0110122 | A1 | 4/2018 | Lee |
| 2019/0229446 | A1 | 7/2019 | Kim et al. |
| 2021/0043600 | A1 | 2/2021 | Park et al. |
| 2021/0074798 | A1 | 3/2021 | Kim et al. |

FOREIGN PATENT DOCUMENTS

| | | |
|---|---|---|
| KR | 10-2018-0100013 | 9/2018 |
| KR | 10-2019-0079086 | 7/2019 |
| KR | 10-2021-0017144 | 2/2021 |
| KR | 10-2021-0030539 | 3/2021 |

ELECTRONIC APPARATUS

CROSS-REFERENCE TO RELATED APPLICATIONS

This application claims priority from and the benefit of Korean Patent Application No. 10-2020-0061691, filed on May 22, 2020, which is hereby incorporated by reference for all purposes as if fully set forth herein.

BACKGROUND

Field

Exemplary embodiments of the invention relate generally to an electronic apparatus and, more specifically, to an electronic apparatus having improved reliability.

Discussion of the Background

In electronic apparatuses, display panels are manufactured and then circuit boards is are connected to the display panels. For example, a tape automated bonding (TAB) mounting method uses an anisotropic conductive film (ACF) to bond a circuit board to a display panel.

The above information disclosed in this Background section is only for understanding of the background of the inventive concepts, and, therefore, it may contain information that does not constitute prior art.

SUMMARY

Electronic apparatus constructed according to exemplary embodiments of the invention are capable of improving durability by including a circuit board disposed between a display panel and a protective film.

Additional features of the inventive concepts will be set forth in the description which follows, and in part will be apparent from the description, or may be learned by practice of the inventive concepts.

An electronic apparatus according to an exemplary embodiment includes a display module having a front surface and a rear surface opposing the front surface, the display module including pixels disposed on the front surface and a display pad connected to the pixels and exposed from the rear surface, a protective film disposed on the rear surface of the display module, a circuit board disposed between the display module and the protective film and having a front surface facing the rear surface of the display module and a rear surface opposing the front surface of the circuit board, the circuit board including a first substrate pad connected to the display pad and exposed from the front surface of the circuit board and a second substrate pad exposed from the rear surface of the circuit board, and a driving element connected to the second substrate pad to drive the pixels, in which the second substrate pad and the protective film are spaced apart from each other.

The circuit board may further include a first solder resist layer, a plurality of substrate insulating layers disposed on the first solder resist layer and including at least one of polyimide and polyethylene terephthalate (PET), a plurality of substrate signal lines disposed between the substrate insulating layers, and a second solder resist layer covering the substrate insulating layers, in which the first substrate pad and the second substrate pad may be connected to the same substrate signal line among the substrate signal lines.

The first substrate pad may overlap at least a portion of the second substrate pad.

The first substrate pad may be spaced apart from the second substrate pad, and the driving element may be surrounded by the protective film.

The protective film may include a through accommodation hole, and the driving element may be accommodated in the accommodation hole.

The circuit board may include a line area in which the substrate signal lines are disposed, and a dummy area adjacent to the line area.

The electronic apparatus may further include an electronic module disposed on a lower side of the protective film, and including at least one of an audio output module, a light emitting module, a light receiving module, and a camera module, in which the circuit board may further include a connector connected to the electronic module.

The circuit board may further include a metal pattern disposed in the dummy area.

The display module may include a base substrate including a base layer including an organic material and a barrier layer including an inorganic material disposed on the base layer, a transistor disposed on the base layer and including a semiconductor pattern having a plurality of electrodes, an organic light emitting element connected to the transistor, and a signal line connecting the transistor and the display pad, in which the signal line may be disposed on the same layer as at least one of the electrodes of the semiconductor pattern.

The base substrate may include a substrate hole penetrating through the base layer and the barrier layer and exposing a portion of the signal line, and the display pad may include a conductive pattern filled in the substrate hole.

The base substrate may further include an additional barrier layer disposed on a lower side of the base layer, and an additional base layer disposed on a lower side of the additional barrier layer and including polyimide, the base substrate may include a substrate hole penetrating through the base layer, the barrier layer, the additional base layer, and the additional barrier layer and exposing a portion of the signal line, and the display pad may be formed of a metal filled in the substrate hole.

The electronic apparatus includes an adhesive layer disposed between the display module and the circuit board to bond the display module and the circuit board, in which the adhesive layer includes at least one of a pressure sensitive adhesive (PSA), an optical clear adhesive (OCA), and an optical clear resin (OCR).

The adhesive layer may include an antistatic material.

The display pad, the first substrate pad, the second substrate pad, and the driving element may be connected through an anisotropic conductive film (ACF).

The protective film may include at least one of a light blocking layer, a heat dissipation layer, and a cushion layer.

The circuit board may cover the entire rear surface of the display module.

An electronic apparatus according to another exemplary embodiment includes a display module having a front surface and a rear surface opposing the front surface, the display module including pixels disposed on the front surface and a display pad connected to the pixels and exposed from the rear surface, a circuit board having a front surface facing the rear surface of the display module and a rear surface opposing the front surface of the circuit board, the circuit board including a first substrate pad exposed from the front surface of the circuit board and a second substrate pad exposed from the rear surface of the circuit board, and a driving element connected to the second substrate pad to drive the pixels, in which the circuit board covers substantially the entire rear surface of the display module.

The circuit board may further include a first solder resist layer, a plurality of substrate insulating layers disposed on the first solder resist layer and including at least one of polyimide and polyethylene terephthalate (PET), a plurality of substrate signal lines disposed between the substrate insulating layers, and a second solder resist layer covering the substrate insulating layers, in which the first substrate pad and the second substrate pad may be connected to the same substrate signal line among the substrate signal lines.

The circuit board may include a line area in which the substrate signal lines are disposed, and a dummy area adjacent to the line area.

The circuit board may further include a metal pattern disposed in the dummy area.

The display module may include a base substrate comprising a base layer including an organic material, and a barrier layer including an inorganic material disposed on the base layer, a transistor disposed on the base layer and including a semiconductor pattern having a plurality of electrodes, an organic light emitting element connected to the transistor, and a signal line connecting the transistor and the display pad, in which the signal line may be disposed on the same layer as at least one of the electrodes of the semiconductor pattern.

The base substrate may include a substrate hole penetrating through the base layer and the barrier layer and exposing a portion of the signal line, and the display pad may include a conductive pattern filled in the substrate hole.

The base substrate may further include an additional barrier layer disposed on a lower side of the base layer, and an additional base layer disposed on a lower side of the additional barrier layer and including polyimide, the substrate hole may penetrate through the base layer, the barrier layer, the additional base layer, and the additional barrier layer and expose a portion of the signal line, and the display pad may be formed of a metal filled in the substrate hole.

The electronic apparatus may further include a protective film disposed on a lower side of the display module, and including at least one of a light blocking layer, a heat dissipation layer, and a cushion layer It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
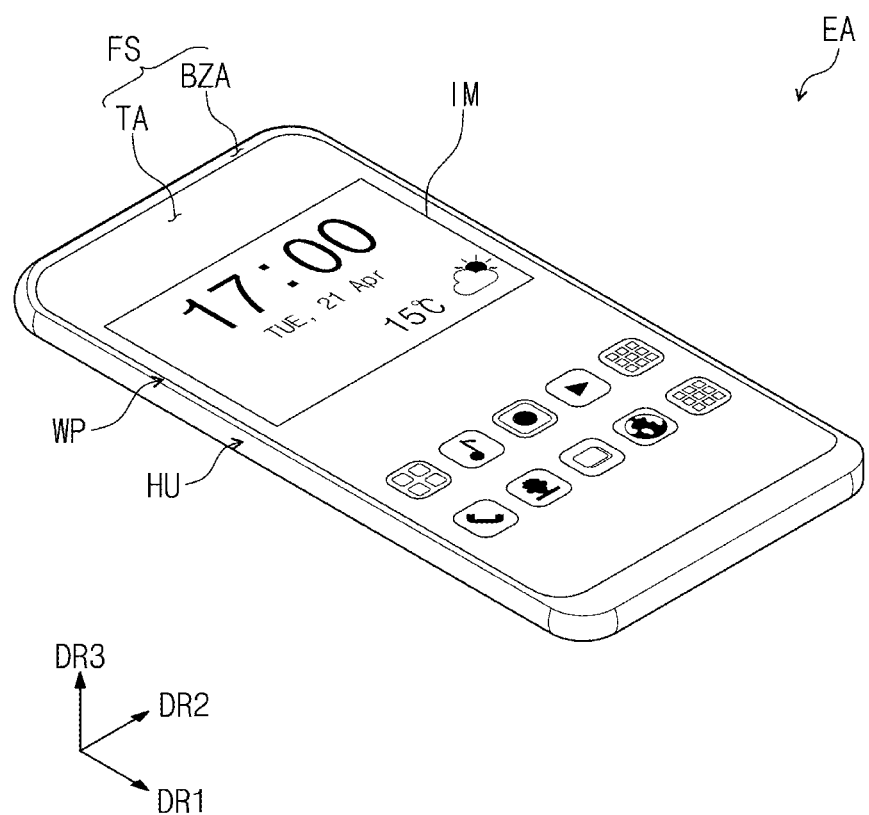
FIG. 1 is a perspective view of an electronic apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
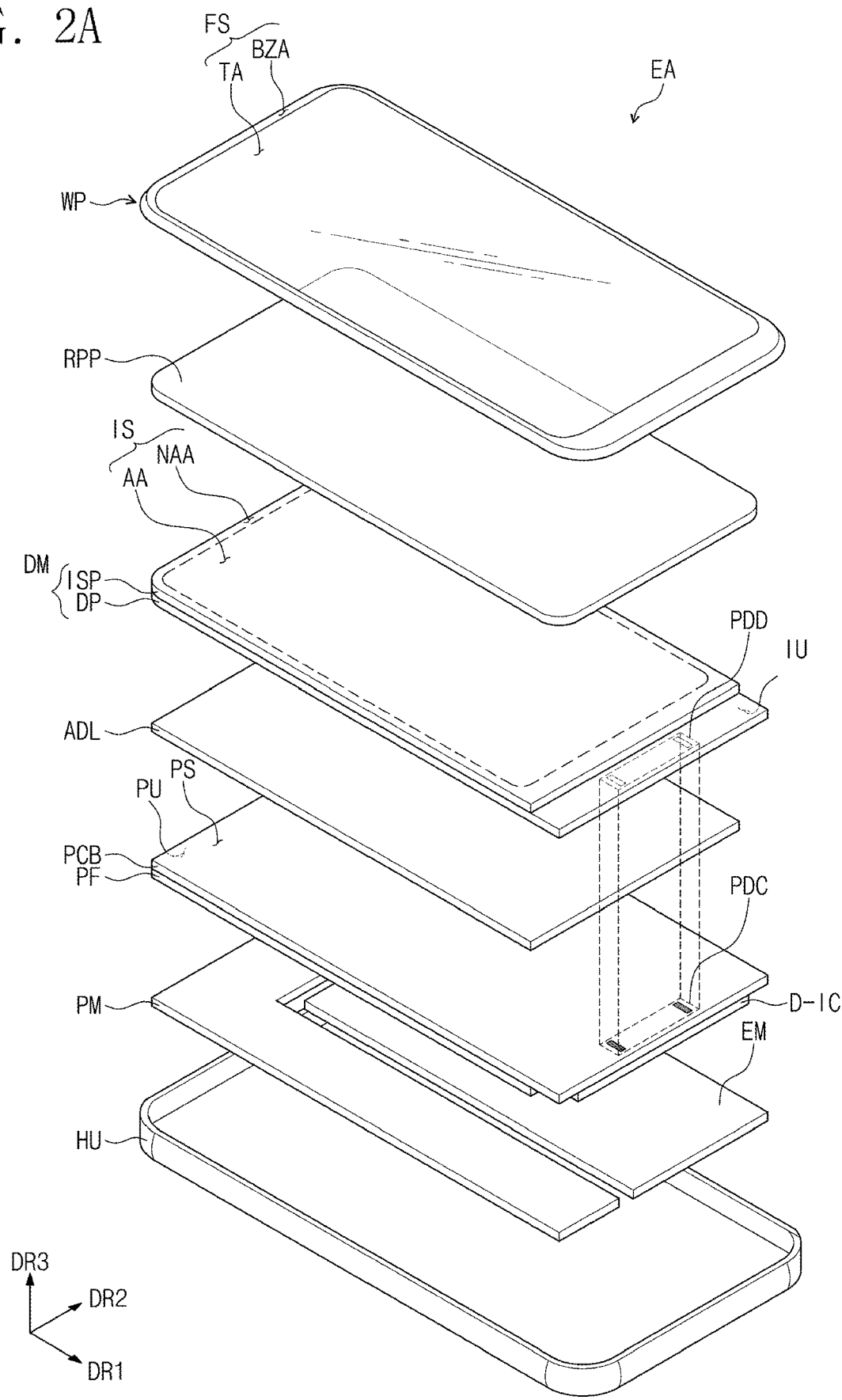
FIG. 2A is an exploded perspective view of an electronic apparatus according to an exemplary embodiment.
Figure 2B:
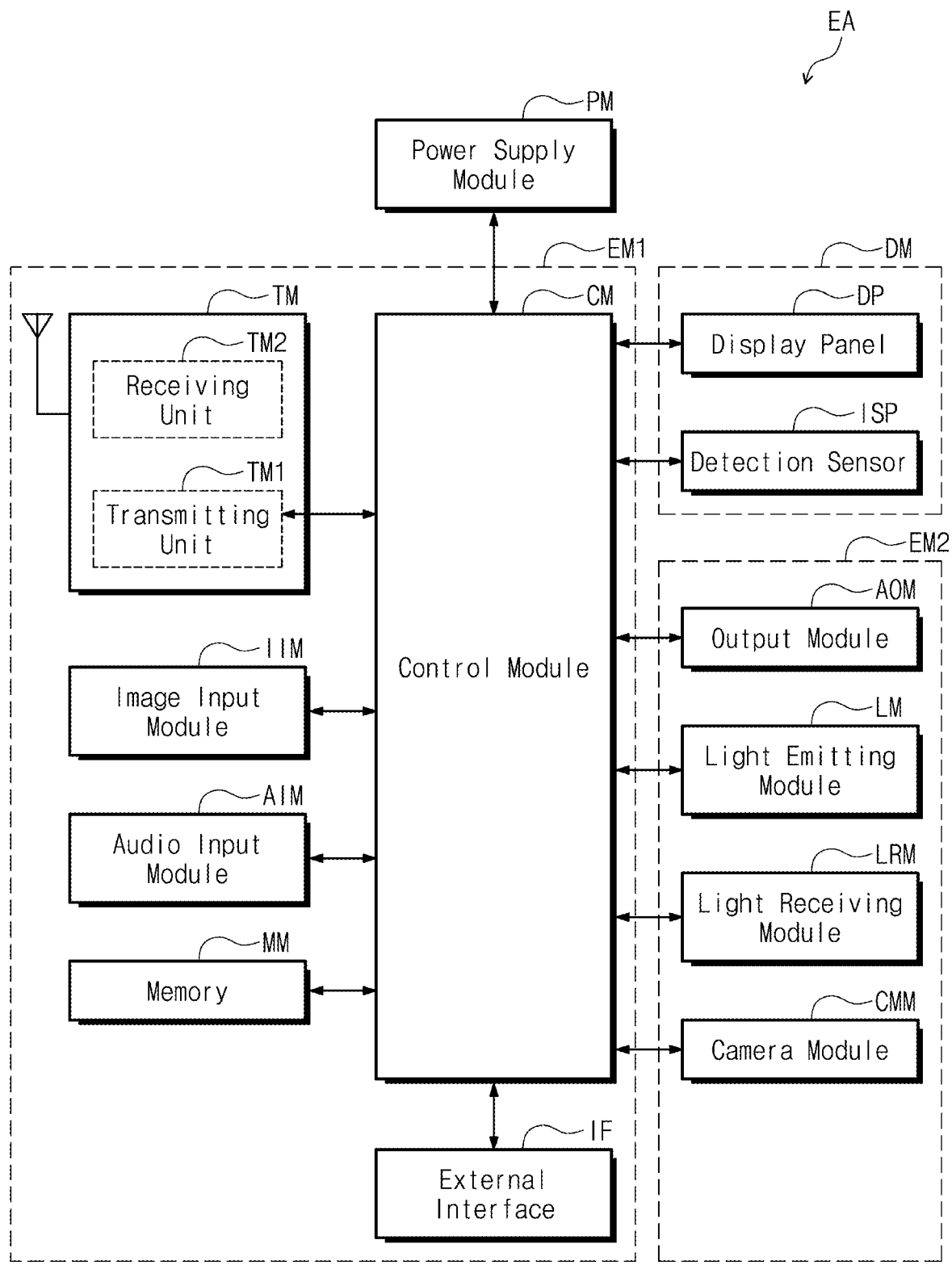
FIG. 2B is a block diagram of an electronic module according to an exemplary embodiment.
Figure 3A:
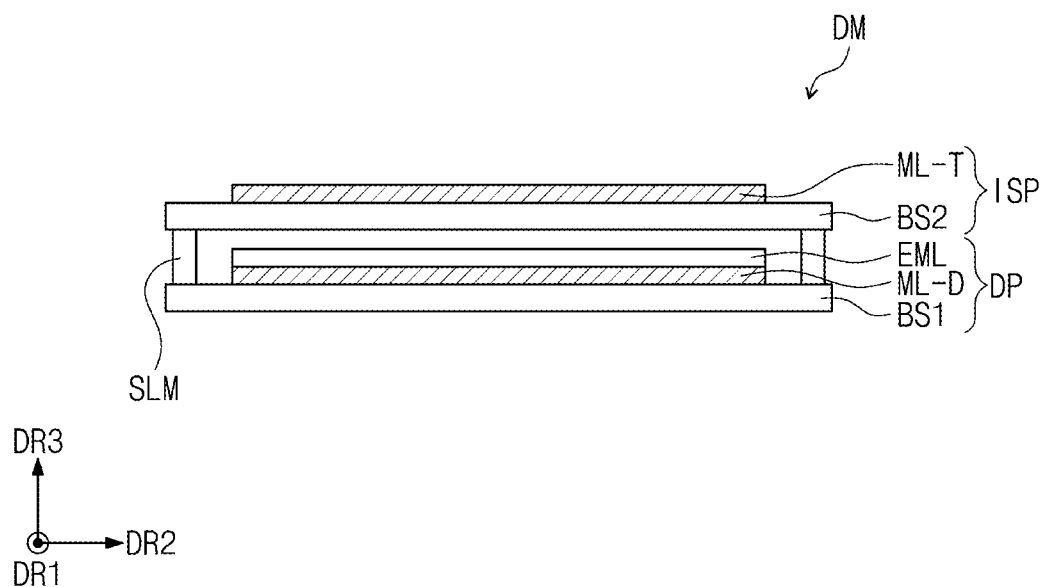
FIG. 3A is a cross-sectional view of a display module according to an exemplary embodiment.
Figure 3B:
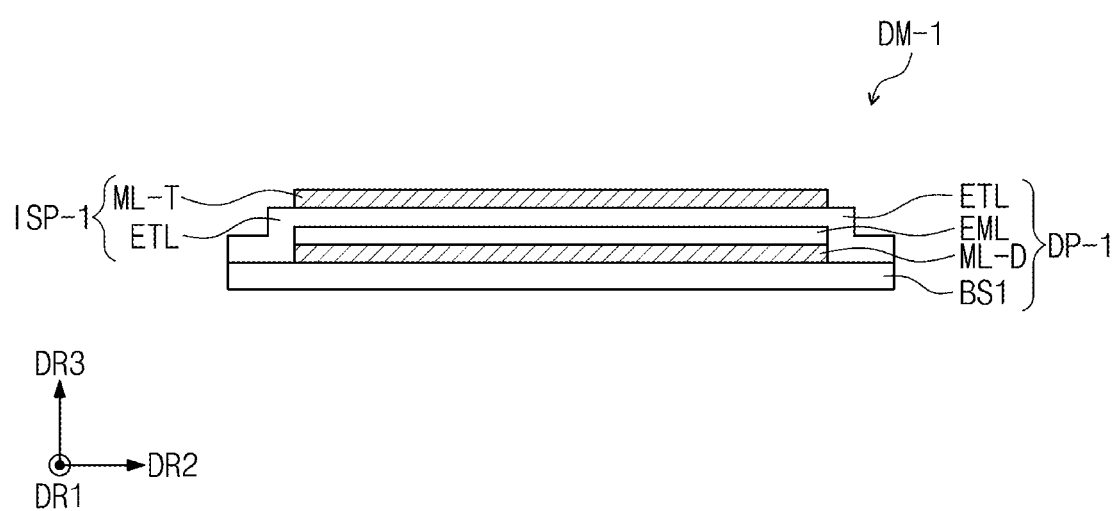
FIG. 3B is a cross-sectional view of a display module according to an exemplary embodiment.
Figure 4:
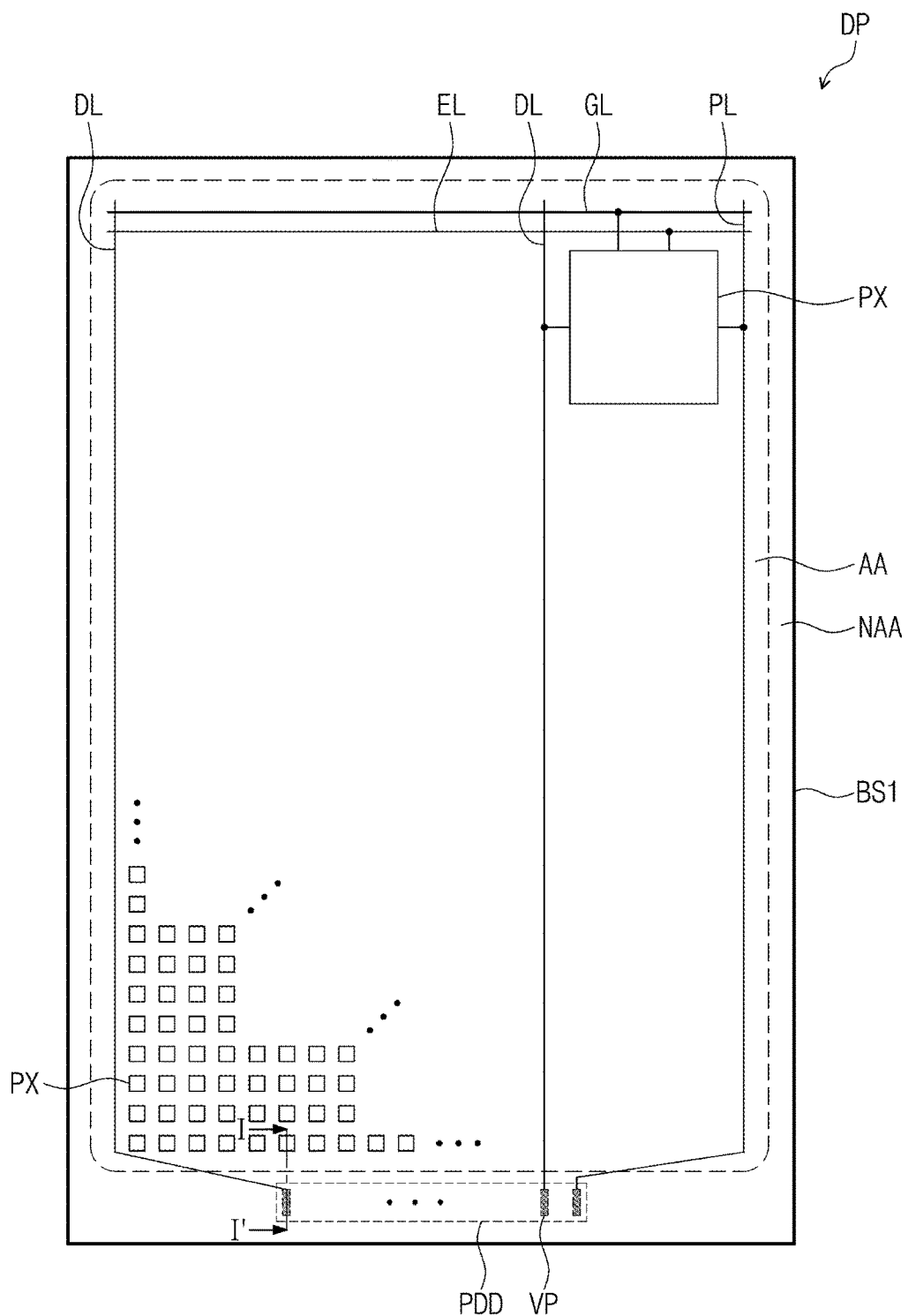
FIG. 4 is a plan view of a display panel according to an exemplary embodiment.
Figure 5:
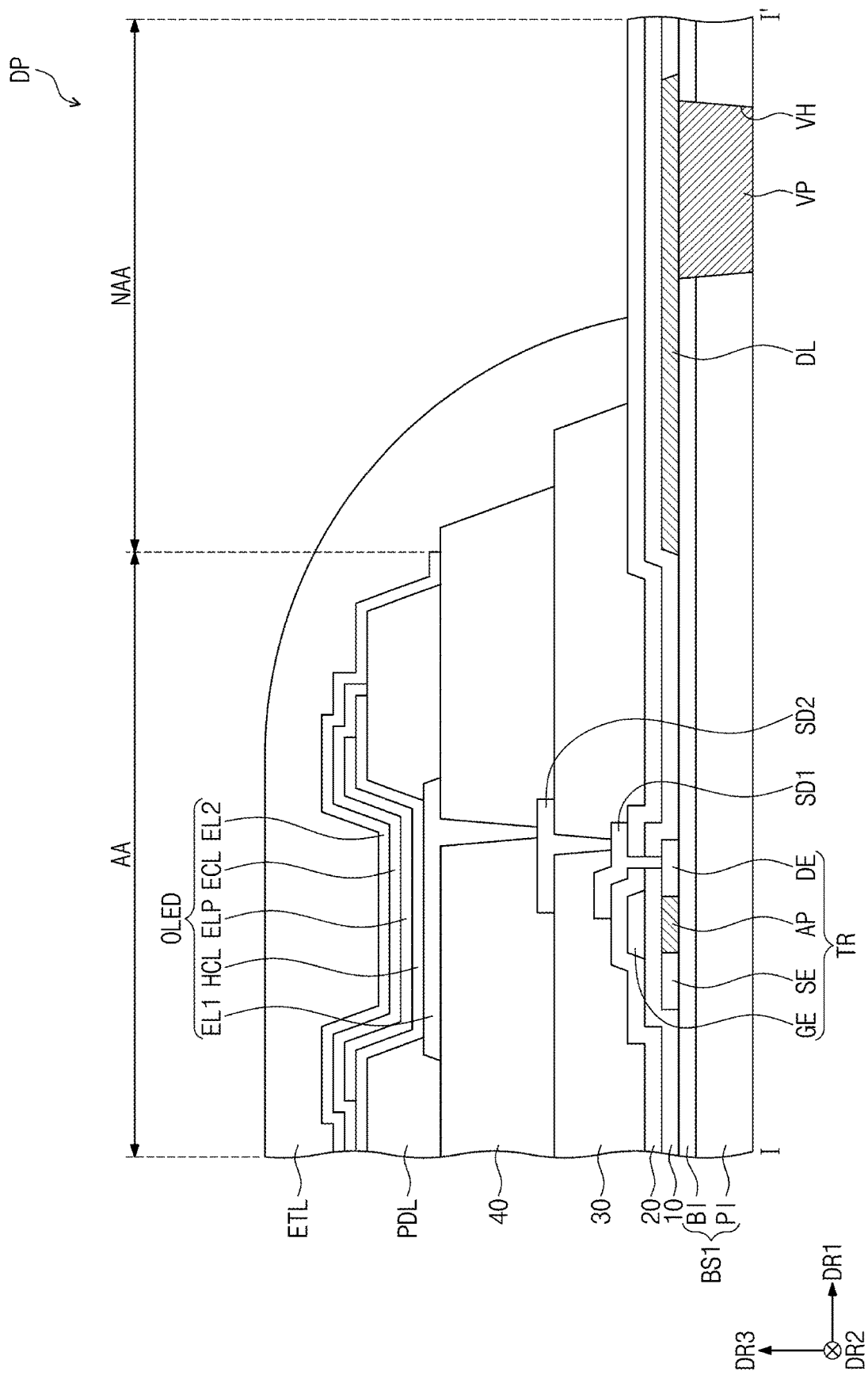
FIG. 5 is a cross-sectional view taken along line I-I' of FIG. 4 according to an exemplary embodiment.
Figure 6:
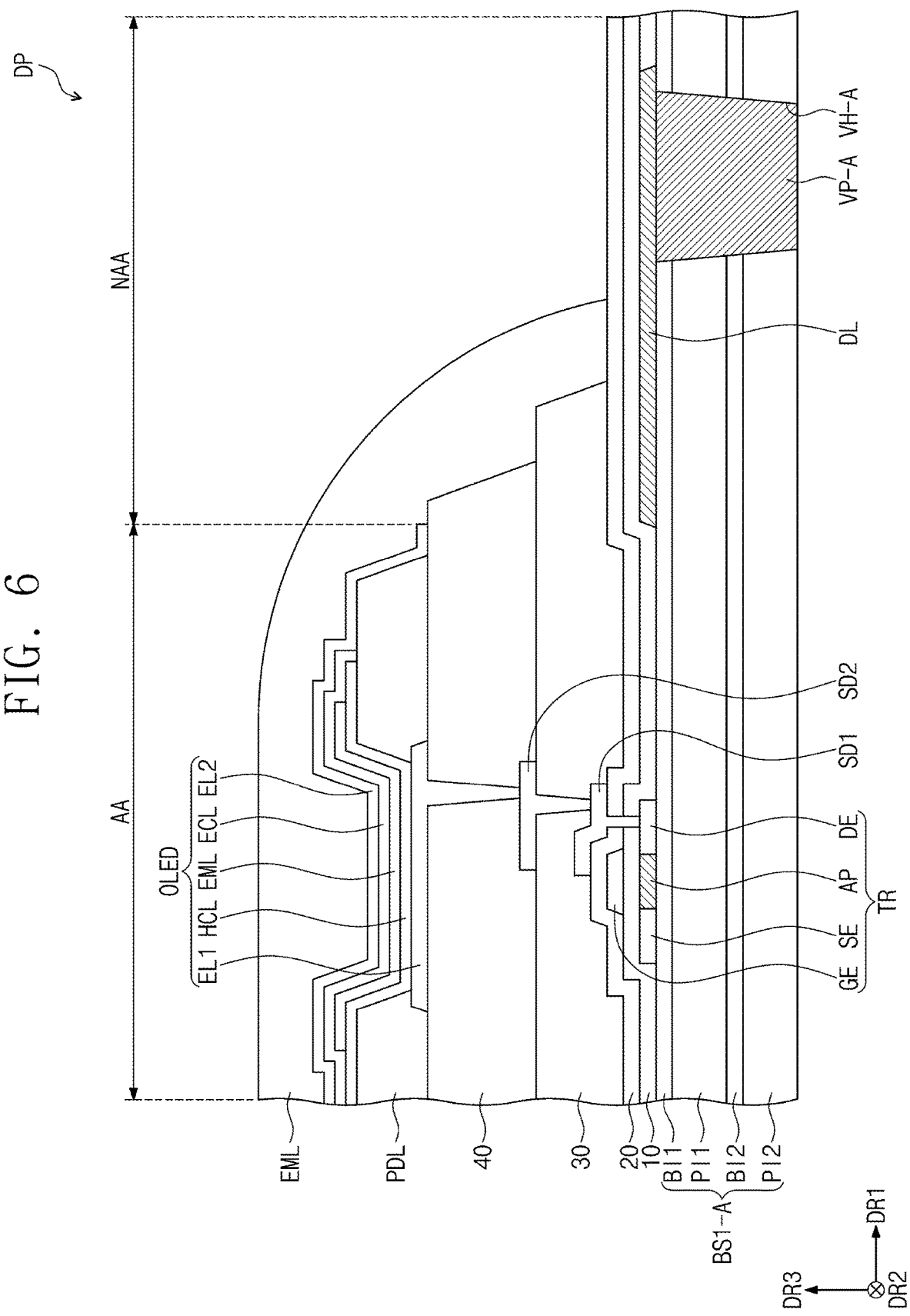
FIG. 6 is a cross-sectional view taken along line I-I' of FIG. 4 according to another exemplary embodiment.

FIG. 1 is a perspective view of an electronic apparatus according to an exemplary embodiment. FIG. 2A is an exploded perspective view of an electronic apparatus according to an exemplary embodiment. FIG. 2B is a block diagram of an electronic module according to an exemplary embodiment. FIG. 3A is a cross-sectional view of a display module according to an exemplary embodiment. FIG. 3B is a cross-sectional view of a display module according to an exemplary embodiment. FIG. 4 is a plan view of a display panel according to an exemplary embodiment. FIG. 5 is a cross-sectional view taken along line I-I' of FIG. 4 according to an exemplary embodiment. FIG. 6 is a cross-sectional view of s display panel taken along line I-I' of FIG. 4 according to another exemplary embodiment.

Referring to FIGS. 1 and 2, an electronic apparatus EA may be an apparatus activated according to electrical signals. The electronic apparatus EA may be employed in various applications. For example, the electronic apparatus EA may be used for large-sized display apparatuses, such as a television set, a monitor, or an outdoor billboard, as well as for small- and medium-sized display apparatuses, such as a personal computer, a laptop computer, a personal digital terminal, a car navigation unit, a game console, a portable electronic apparatus, and a camera. The inventive concepts are not limited thereto, and the electronic apparatus may be adopted for other display apparatuses. Hereinafter, the electronic apparatus EA will exemplarily be illustrated as a smartphone.

The electronic apparatus EA may display an image IM toward a third direction DR3 on a display surface FS, which is parallel to a first direction DR1 and a second direction DR2, respectively. The image IM may include a still image as well as a dynamic image. FIG. 1 illustrates a watch window and icons as an example of the image IM. The display surface FS on which the image IM is displayed may correspond to a front surface of the electronic apparatus EA, and may correspond to a front surface of a window panel WP.

As used herein, a front surface (or an upper surface) and a rear surface (or a lower surface) of each member is defined with respect to a direction in which the image IM is displayed. Front and rear surfaces may oppose each other in a third direction DR3, and the normal direction of each of the front and rear surfaces may be parallel to the third direction DR3. Meanwhile, the directions indicated by the first to third directions DR1, DR2, and DR3 are relative concepts, and may thus be changed to other directions. As used herein, "on a plane" may be defined as being viewed from the third direction DR3.

The electronic apparatus EA may include a window panel WP, an anti-reflection panel RPP, a display module DM, a circuit board PCB, a driving element D-IC, a protective film PF, and an electronic module EM, a power supply module PM, and a housing HU. In the illustrated exemplary embodiment, the window panel WP and the housing HU may be combined to form the exterior of the electronic apparatus EA.

The window panel WP may include an optically transparent insulating material. For example, the window panel WP may include glass or plastic. The window panel WP may have a multi-layer structure or a single-layer structure. For example, the window panel WP may include a plurality of plastic films which are bonded through an adhesive, or may include a glass substrate and a plastic film which are bonded through an adhesive.

As described above, the display surface FS of the window panel WP may define a front surface of the electronic apparatus EA. A transmission area TA may be an optically transparent area. For example, the transmission area TA may have a visible light transmittance of about 90% or greater.

A bezel area BZA may have a relatively lower light transmittance than the transmission area TA. The bezel area BZA may define the shape of the transmission area TA. The bezel area BZA may be adjacent to the transmission area TA and may surround the transmission area TA.

The bezel area BZA may have a predetermined color. The bezel area BZA may cover a peripheral area NAA of the display module DM to prevent the peripheral area NAA from being viewed from the outside. In some exemplary embodiments, the bezel area BZA may be omitted.

The anti-reflection panel RPP may be disposed under the window panel WP. The anti-reflection panel RPP may reduce reflectance of external light incident from an upper side of the window panel WM. In some exemplary embodiments, the anti-reflection panel RPP may be omitted, and may be included in the display module DM.

The display module DM may display an image IM and sense an external input. The display module DM may include a front surface IS having an active area AA and a peripheral area NAA. The active area AA may be an area activated according to electrical signals.

The active area AA according to an exemplary embodiment may be an area displaying an image IM, and may also be an area sensing an external input. The transmission area TA may overlap at least a portion of the active area AA. For example, the transmission area TA may overlap the front surface IS or at least a portion of the active area AA.

Accordingly, a user may view the image IM through the transmission area TA or provide an external input. However, the inventive concepts are not limited thereto, and in some exemplary embodiments, an area displaying the image IM and an area sensing an external input may be separated from each other in the active area AA, for example.

The peripheral area NAA may be an area covered by the bezel area BZA. The peripheral area NAA may be adjacent to the active area AA. The peripheral area NAA may surround the active area AA. A driving element or a driving wiring for driving the active area AA may be disposed in the peripheral area NAA.

The display module DM may include a display panel DP and a detection sensor ISP. The display panel DP may be configured to substantially generate an image IM. The image IM generated by the display panel DP may be viewed by a user through the transmission area TA from the outside.

The detection sensor ISP may sense an external input applied from the outside. For example, the detection sensor ISP may sense an external input provided to the window panel WP.

The external input may include various forms of inputs provided from the outside the electronic apparatus EA. For example, the external input may include an external input applied when approaching the electronic apparatus EA or being adjacent by a predetermined distance (e.g., hovering), as well as contact by a part of the body, such as a user's hand. In addition, the external input may be provided in various forms, such as force, pressure, and light, without being limited thereto.

The display module DM includes a display pad area PDD. Display pads of the display pad area PDD may be arranged in the second direction DR2, and the plurality of display pads may be exposed from a rear surface IU of the display module DM.

The display pad area PDD may be an area connected to a substrate pad area PDC of a circuit board PCB. The display module DM includes a plurality of display pads disposed in the display pad area PDD. The display pads may be disposed on the rear surface IU of the display module DM.

The circuit board PCB may be disposed on the lower side of the display module DM. More particularly, the circuit board PCB may be disposed on the rear surface IU of the display module DM. The circuit board PCB may cover at least a portion of the rear surface IU of the display module DM.

The circuit board PCB includes the substrate pad area PDC. The plurality of pads in the substrate pad area PDC may be exposed from a front surface PS of the circuit board PCB.

As described above, the substrate pad area PDC may be an area connected to the display pad area PDD of the display module DM. The substrate pad area PDC may include a plurality of pads corresponding to the substrate pads included in the display pad area PDD.

The circuit board PCB is electrically connected to the display module DM. The circuit board PCB may generate electrical signals and provide the electrical signals to the display module DM, or receive and process electrical signals generated from the display module DM.

The electrical signals generated in the circuit board PCB may be provided to a pixel PX through signal lines of the display panel DP. The signal lines may include at least one or more of a power line PL, a scan line GL, a data line DL, and a light emitting control line EL, which will be described in more detail later with reference to FIG. 4.

An adhesive layer ADL may be disposed between the display module DM and the circuit board PCB to bond the display module DM and the circuit board PCB. The area of the adhesive layer ADL in the first direction DR1 and the second direction DR2 may be less than each area of the display module DM and the circuit board PCB.

The adhesive layer ADL may be spaced apart from the display pad area PDD exposed on the rear surface IU of the display module DM and the substrate pad area PDC exposed in the front surface PS of the circuit board PCB. Accordingly, the display pad area PDD and the substrate pad area PDC may be electrically connected to each other without the adhesive layer ADL therebetween.

The adhesive layer ADL may include a pressure sensitive adhesive (PSA), optical clear adhesive (OCA), and/or optical clear resin (OCR).

The adhesive layer ADL according to an exemplary embodiment may include an antistatic material well known in the art. In this manner, the adhesive layer ADL including an antistatic material may prevent static electricity from flowing into the display module DM.

The driving element D-IC may be disposed on the rear surface PU of the circuit board PCB to be connected to the circuit board PCB. The circuit board PCB may electrically connect the driving element D-IC and the display module DM, and the driving element D-IC may generate electrical signals to be provided to the display module DM or process electrical signals provided from the display module DM.

The driving element D-IC may include a gate driving circuit generating gate signals or a data driving circuit generating data signals. However, the inventive concepts are not limited thereto, and the driving element D-IC in some exemplary embodiments may include various control circuits generating and processing various control signals for driving the display module DM.

The protective film PF may be disposed on the rear surface PU of the circuit board PCB to be bonded to the circuit board PCB through an adhesive layer. The protective film PF may be disposed on the lower side of the display module DM to protect the display module DM from external impact.

The protective film PF may be spaced apart from a second substrate pad IP (see FIG. 7B) exposed on the rear surface of the display module DM. As used herein, the term "spaced apart" may refer to "non-overlapping" on a plane.

The protective film PF may include a plurality of layers. For example, the protective film PF may include a light blocking layer, a heat dissipation layer, a cushion layer, and a plurality of adhesive layers.

The light blocking layer may prevent components disposed on the rear surface of the display module DM from being viewed. The light blocking layer may include a binder and a plurality of pigment particles dispersed therein. The pigment particles may include carbon black, etc.

The display module DM according to an exemplary embodiment may include a protective film PF including a light blocking layer to enhance light blocking properties along with impact resistance properties. In this manner, an electronic apparatus EA employing the display module DM according to an exemplary embodiment may have improved visibility together with reliability against external shock or stress generated during use.

The heat dissipation layer may effectively dissipate heat generated from the display module DM. The heat dissipation layer may be provided as a metal plate having good heat dissipation properties. For example, the heat dissipation layer may include at least any one among stainless steel, graphite, copper (Cu), and aluminum (Al), but is not limited thereto. The heat dissipation layer may not only enhance heat dissipation properties, but also have electromagnetic wave shielding or electromagnetic wave absorption properties.

The cushion layer may include any one among a sponge, a foam, or a urethane resin. When the cushion layer includes a foam, the cushion layer includes a matrix member and a plurality of voids. The plurality of voids may be defined by the matrix member being dispersed in the matrix member. The cushion layer may have elasticity and a porous structure.

The matrix member may include a flexible material. For example, the matrix layer may include a synthetic resin. For example, the matrix layer may include at least any one among acrylonitrile butadiene styrene copolymer (ABS), polyurethane (PU), polyethylene (PE), ethylene vinyl acetate (EVA), and polyvinyl chloride (PVC).

A plurality of voids easily absorbs shocks applied to the cushion layer. The plurality of voids may be defined by a porous structure of the cushion layer. The plurality of voids ensures facilitates transformation in the shape of the cushion layer to secure the elasticity of the cushion layer, thereby enhancing impact resistance of the electronic apparatus EA. The cushion layer may include a plurality of synthetic resins, without being limited thereto.

Referring to FIG. 2B, the electronic apparatus EA may include the display module DM, a power supply module PM, and an electronic module EM. The electronic module EM may include a first electronic module EM1 and a second electronic module EM2. The display module DM, the power supply module PM, the first electronic module EM1, and the second electronic module EM2 may be electrically connected to each other.

The display module DM may include a display panel DP and a detection sensor ISP. The display panel DP may be configured to generate an image IM, and the detection sensor ISP may be configured to sense an external input.

The first electronic module EM1 and the second electronic module EM2 may include various functional modules for operating the electronic apparatus EA. The first electronic module EM1 may be mounted on a motherboard electrically connected to the display module DM, or may be mounted on a separate substrate to be electrically connected to a motherboard through a connector.

The first electronic module EM1 may include a control module CM, a wireless communication module TM, an image input module IIM, an audio input module AIM, a memory MM, and an external interface IF. Some of the modules may not be mounted on a motherboard, but may be electrically connected to the motherboard through the circuit board PCB.

The control module CM controls the overall operation of the electronic apparatus EA. The control module CM may include a microprocessor. For example, the control module CM activates or deactivates the display module DM. The control module CM may control other modules, such as the image input module IIM or the audio input module AIM, based on touch signals received from the display module DM.

The wireless communication module TM may transmit/receive wireless signals with other terminals using a Bluetooth or Wi-Fi line. The wireless communication module TM may transmit/receive voice signals using a general communication line. The wireless communication module TM includes a transmitting unit TM1 modulating signals to be transmitted and transmitting the signals, and a receiving unit TM2 demodulating the received signals.

The image input module IIM processes image signals and converts the signals into image data that may be displayed on the display module DM. The sound input module AIM receives external sound signals by a microphone in a recording mode, a voice recognition mode, etc., and converts the signals into electrical voice data.

The external interface IF may be an interface connected to an external charger, a wired/wireless data port, a card socket (e.g., a memory card, a SIM/UIM card), etc.

The second electronic module EM2 may include an audio output module AOM, a light emitting module LM, a light receiving module LRM, and a camera module CMM. These components may be directly mounted on a motherboard, or mounted on a separate substrate to be electrically connected to the display module DM through a connector, or may be electrically connected to a first electronic module EM1.

The sound output module AOM converts sound data received from the wireless communication module TM or sound data stored in the memory MM and outputs the data to the outside.

The light emitting module LM generates and outputs light. The light emitting module LM may output infrared light. For example, the light emitting module LM may include an LED element. For example, the light receiving module LRM may detect infrared light. The light receiving module LRM may be activated upon detecting infrared light having a predetermined level or higher. The light receiving module LRM may include a CMOS sensor. After the infrared light generated from the light emitting module LM is output to be reflected by an external subject (e.g., a user's finger or face), and the reflected infrared light may be incident on the light receiving module LRM. The camera module CMM may capture an external image.

The power supply module PM supplies power required for the overall operation of the electronic apparatus EA. The power supply module PM may include a conventional battery module.

Referring to FIG. 3A, the display module DM may include a display panel DP, a detection sensor ISP, and a bonding member SLM.

The display panel DP may include a first base substrate BS1, a circuit element layer ML-D, and a display element layer EML. The detection sensor ISP may include a second base substrate BS2 and a sensing circuit layer ML-T.

The first base substrate BS1 and the second base substrate BS2 each may be a silicon substrate, a plastic substrate, a glass substrate, an insulating film, or a stack structure including a plurality of insulating layers.

The circuit element layer ML-D may be disposed on the first base substrate BS1. The circuit element layer ML-D may include a plurality of insulating layers, a plurality of conductive layers, and a semiconductor layer. The plurality of conductive layers of the circuit element layer ML-D may form the signal lines or a control circuit for the pixels.

The display element layer EML may be disposed on the circuit element layer ML-D. The display element layer EML may include organic light emitting diodes. However, the inventive concepts are not limited thereto, and the display element layer EML may include inorganic light emitting diodes, organic-inorganic light emitting diodes, or a liquid crystal layer in other exemplary embodiments.

The second base substrate BS2 may be disposed on the display element layer EML. A predetermined space may be defined between the second base substrate BS2 and the display element layer EML. The space may be filled with air or an inert gas. In some exemplary embodiments, the space may be additionally or alternatively filled with fillers, such as a silicone-based polymer, an epoxy-based resin, or an acrylic-based resin.

The sensing circuit layer ML-T may be disposed on the second base substrate BS2. The sensing circuit layer ML-T may include a plurality of insulating layers and a plurality of conductive layers. The plurality of conductive layers may include sensing electrodes sensing an external input, sensing wirings electrically connected to sensing electrodes, and sensing pads electrically connected to sensing wirings.

A bonding member SLM may be disposed between the first base substrate BS1 and the second base substrate BS2. The bonding member SLM may bond the first base substrate BS1 and the second base substrate BS2. The bonding member SLM may include an organic material, such as a photo-curable resin or a photo-plastic resin, or an inorganic material, such as a frit seal, without being limited thereto.

Referring to FIG. 3B, the display module DM-1 according to an exemplary embodiment may include a display panel DP-1 and a detection sensor ISP-1.

The display panel DP-1 may include a first base substrate BS1, a circuit element layer ML-D, a display element layer EML, and a thin film encapsulation layer ETL. The sensing sensor ISP-1 may include a sensing circuit layer ML-T. The thin film encapsulation layer ETL and the second base substrate BS2 may have substantially the same configuration.

The thin film encapsulation layer ETL may seal the display element layer EML from the outside to prevent moisture, oxygen, or the like from flowing into the display element layer EML. The thin film encapsulation layer ETL may include an organic layer and a plurality of inorganic layers sealing the organic layer.

The inorganic layers may prevent external moisture, oxygen, or the like from penetrating the display element layer EML. The inorganic layers may include silicon oxide ($SiO_x$), silicon oxynitride ($SiO_xN_y$), zirconium oxide ($ZrO_x$), or a combination thereof. The inorganic layers may be formed through a deposition process, for example.

The organic layer may be disposed on the display element layer EML to provide a flat surface. Curves or particles formed on an upper surface of the display element layer EML may be covered by the organic layer to prevent components formed on the organic layer, for example, the detection sensor ISP from being affected.

According to an exemplary embodiment, the display panel DP-1 and the detection sensor ISP-1 may be formed through a continuous process. In particular, the sensing circuit layer ML-T may be directly formed on the thin film encapsulation layer ETL.

Referring to FIG. 4, the display panel DP may include a plurality of pixels PX, a plurality of signal lines GL, DL, PL, and EL, and a plurality of display pads VP.

The active area AA of the display panel DP may be an area displaying an image, and the peripheral area NAA may be an area in which a driving circuit, a driving wiring, etc. may be disposed. In the active area AA, light emitting areas in which a plurality of pixels PX emitting light and non-light emitting areas adjacent to the light emitting areas may be disposed.

The plurality of signal lines GL, DL, PL, and EL may be connected to the pixels PX to transfer electrical signals to the pixels PX. FIG. 4 exemplarily illustrates a scan line GL, a data line DL, a power line PL, and a light emitting control line EL among the signal lines included in the display panel DP. However, the inventive concepts are not limited thereto, and in some exemplary embodiments, an initialization voltage line may be additionally included in the peripheral area NAA.

In addition, a power pattern may be disposed in the peripheral area NAA to be connected to a plurality of power lines PL. Accordingly, the display panel DP may provide the same power signal to the pixels.

The display pads exposed on the rear surface IU of the display module DM may be provided in plural to be respectively connected to the data lines DL. The remaining display pads may be connected to the power pattern to be electrically connected to the power line PL. The display panel DP may provide electrical signals provided from the driving element D-IC to the pixels PX through the display pads VP.

Referring to FIG. 5, the display panel DP according to an exemplary embodiment may include a plurality of insulating layers, a semiconductor pattern, a conductive pattern, and a signal line. The insulating layer, the semiconductor layer, and the conductive layer may be formed by coating or vapor deposition, for example. Thereafter, the insulating layer, the semiconductor layer, and the conductive layer may be selectively patterned through a photolithography method. In this manner, the semiconductor pattern, the conductive pattern, the signal line, etc. may be formed.

The base substrate BS1 may include a multi-layer structure having a base layer PI and a barrier layer BI. The base layer PI may include an organic material.

For example, the base layer PI may include at least one or more of polyimide, polyethylene naphthalate, polyethylene terephthalate, polyarylate, polycarbonate, polyetherimide, or polyethersulfone. In this manner, the base layer PI may be flexible. However, the inventive concepts are not limited thereto, and in some exemplary embodiments, the base substrate BS1 may be rigid.

The barrier layer BI is disposed on the base layer PI. The barrier layer BI may cover the base layer PI. The barrier layer BI may be an insulating layer including an inorganic material. For example, the barrier layer BI may include at least one or more of aluminum oxide ($AlO_x$), titanium oxide ($TiO_x$), silicon oxide ($SiO_x$), silicon oxynitride ($SiO_xN_y$), zirconium oxide ($ZrO_x$), and hafnium oxide ($HfO_x$). The barrier layer BI may be formed of multilayer inorganic layers. The barrier layer BI may prevent foreign substances entering from the outside.

A transistor TR may include a plurality of electrodes. For example, a source SE, an active AP, and a drain DE of the transistor TR are formed from a semiconductor pattern. The transistor TR controls charge transfer in the semiconductor pattern through the control electrode CE to output electrical signals input from the source SE through the drain DE.

A first insulating layer 10 is disposed on the base substrate BS1. The first insulating layer 10 covers the semiconductor pattern. The first insulating layer 10 may include an inorganic layer and/or an organic layer, and may have a single-layer or multi-layer structure. The first insulating layer 10 may include at least one or more of aluminum oxide ($AlO_x$), titanium oxide ($TiO_x$), silicon oxide ($SiO_x$), silicon oxynitride ($SiO_xN_y$), zirconium oxide ($ZrO_x$), and hafnium oxide ($HfO_x$).

In the illustrated exemplary embodiment, the first insulating layer 10 may be a single-layer silicon oxide ($SiO_x$) layer. Insulating layers that will be described later in addition to the first insulating layer 10 may include inorganic layers and/or organic layers, and may have single-layer or multi-layer structures. The inorganic layer may include at least one of the materials described above.

A gate GE is disposed on the first insulating layer 10. The gate GE may be a part of a metal pattern. The gate GE may overlap the active AP. In the process of doping the semiconductor pattern, the gate GE may function as a mask.

A second insulating layer 20 covering the gate GE is disposed on the first insulating layer 10. The second insulating layer 20 may include an inorganic layer and/or an organic layer, and may have a single-layer or multi-layer structure. In the illustrated exemplary embodiment, the second insulating layer 20 may be a single-layer silicon oxide ($SiO_x$) layer.

A first connection electrode SD1 may be disposed on the second insulating layer 20. The first connection electrode SD1 may be connected to any one of the signal lines illustrated in FIG. 4 through a contact hole penetrating the first insulating layer 10 and the second insulating layer 20.

A third insulating layer 30 is disposed on the second insulating layer 20. The third insulating layer 30 may include an organic layer. A second connection electrode SD2 may be disposed on the third insulating layer 30. The second connection electrode SD2 may be connected to the first connection electrode SD1 through a contact hole penetrating the third insulating layer 30.

A fourth insulating layer 40 covering the second connecting electrode SD2 is disposed on the third insulating layer 30. The fourth insulating layer 40 may include an organic layer.

In the illustrated exemplary embodiment, an organic light emitting diode OLED may include a first electrode EL1, a hole control layer HCL, a light emitting layer ELP, an electron control layer ECL, and a second electrode EL2.

A first electrode EL1 is disposed on the fourth insulating layer 40. The first electrode EL1 is connected to the second connection electrode SD2 through a contact hole penetrating the fourth insulating layer 40.

A display opening is defined in a pixel defining film PDL. The display opening of the pixel defining film PDL exposes at least a portion of the first electrode EL1. The portion of the first electrode EL1 exposed by the display opening may be defined as a light emitting area, and a portion adjacent to the light emitting area may be defined as a non-light emitting area.

The hole control layer HCL may be commonly disposed in the light emitting area and the non-light emitting area. The hole control layer HCL may include a hole transport layer, and may further include a hole injection layer. A light emitting layer ELP is disposed on the hole control layer HCL. The light emitting layer ELP may be disposed in an area corresponding to the display opening. The light emitting layer ELP may be formed separately in each of the pixels.

The electronic control layer ECL is disposed on the light emitting layer ELP. The electron control layer ECL may include an electron transport layer, and may further include an electron injection layer. The hole control layer HCL and the electron control layer ECL may be commonly formed in a plurality of pixels using an open mask. The second electrode EL2 is disposed on the electronic control layer ECL. The second electrode EL2 may be continuously formed in a plurality of pixels in common.

The thin film encapsulation layer ETL is disposed on the second electrode EL2. The thin film encapsulation layer ETL is commonly disposed in a plurality of pixels. In the illustrated exemplary embodiment, the thin film encapsulation layer ETL may directly cover the second electrode EL2. In some exemplary embodiments, a capping layer covering the second electrode EL2 may be further disposed between the thin film encapsulation layer ETL and the second electrode EL2. In this case, the thin film encapsulation layer ETL may directly cover the capping layer. The thin film encapsulation layer ETL according to the illustrated exemplary embodiment may correspond to the thin film encapsulation layer ETL described with reference to FIG. 3B.

According to an exemplary embodiment, one signal line DL of the signal lines shown in FIG. 4 may extend from the semiconductor pattern and be connected to the display pad VP. In particular, the signal line DL may extend from the active area AA to the peripheral area NAA to be connected to the display pad VP.

The signal line DL may be disposed on the same layer as any one of the electrodes included in the transistor TR. For example, the signal line DL may be branched from the source SE. In the illustrated exemplary embodiment, the signal line DL may be disposed on the barrier layer BI.

In the illustrated exemplary embodiment, the base substrate BS1 overlaps the peripheral area NAA, and a substrate hole VH penetrating the base layer PI and the barrier layer BI may be defined in the base substrate BD1 to expose a portion of the signal line DL.

The display pad VP may be connected to a portion of the signal line DL. The display pad VP may be formed of a metal filled in the substrate hole VH. The display pad VP and the signal line DL may be provided in plural to be connected to corresponding pixels PX.

Referring to FIG. 6, a base substrate BS1-A of the display panel DP-A according to the illustrated exemplary embodiment may include a barrier layer BI1, a base layer PI1, an additional barrier layer BI2, and an additional base layer PI2, which are stacked along the third direction DR3.

The components of the display panel DP-A according to the illustrated exemplary embodiment are substantially the same as those of the display panel DP shown in FIG. 5, except for a base substrate BS1-A. As such, repeated descriptions of the substantially the same elements of the display panel DP-A already described above will be omitted to avoid redundancy.

The base substrate BS1-A overlaps the peripheral area NAA, and a substrate hole VH-A penetrating the barrier layer BI1, the base layer PI1, the additional barrier layer BI2, and the additional base layer PI2 may be defined in the base substrate BS1-A to expose a portion of the signal line DL.

A display pad VP-A may be connected to a portion of the signal line DL. The display pad VP-A may be formed of a metal filled in the substrate hole VH-A. The display pad VP-A and the signal line DL may be provided in plural to be connected to corresponding pixels PX.

Figure 7A:
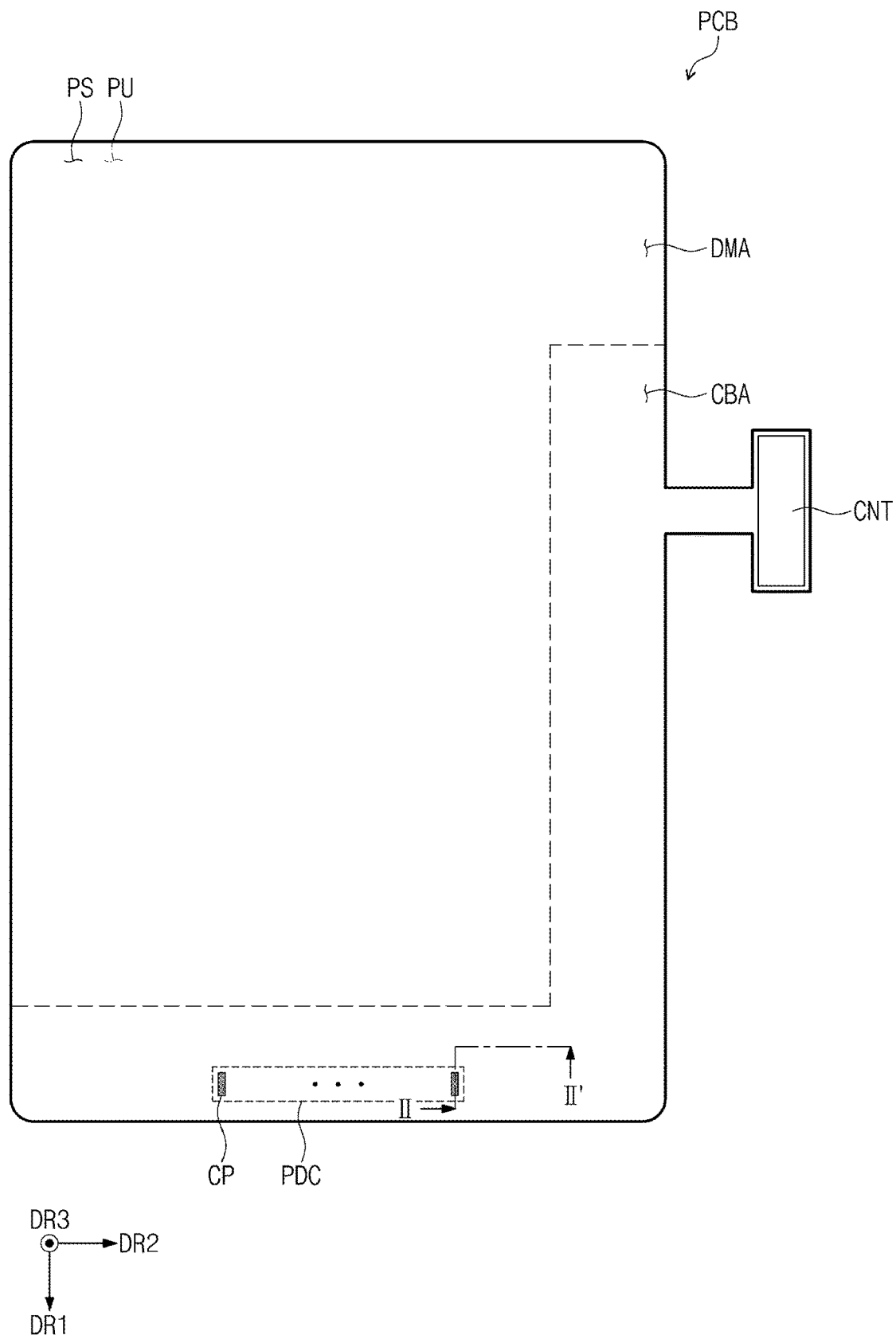
FIG. 7A is a plan view of a circuit board according to an exemplary embodiment.
Figure 7B:
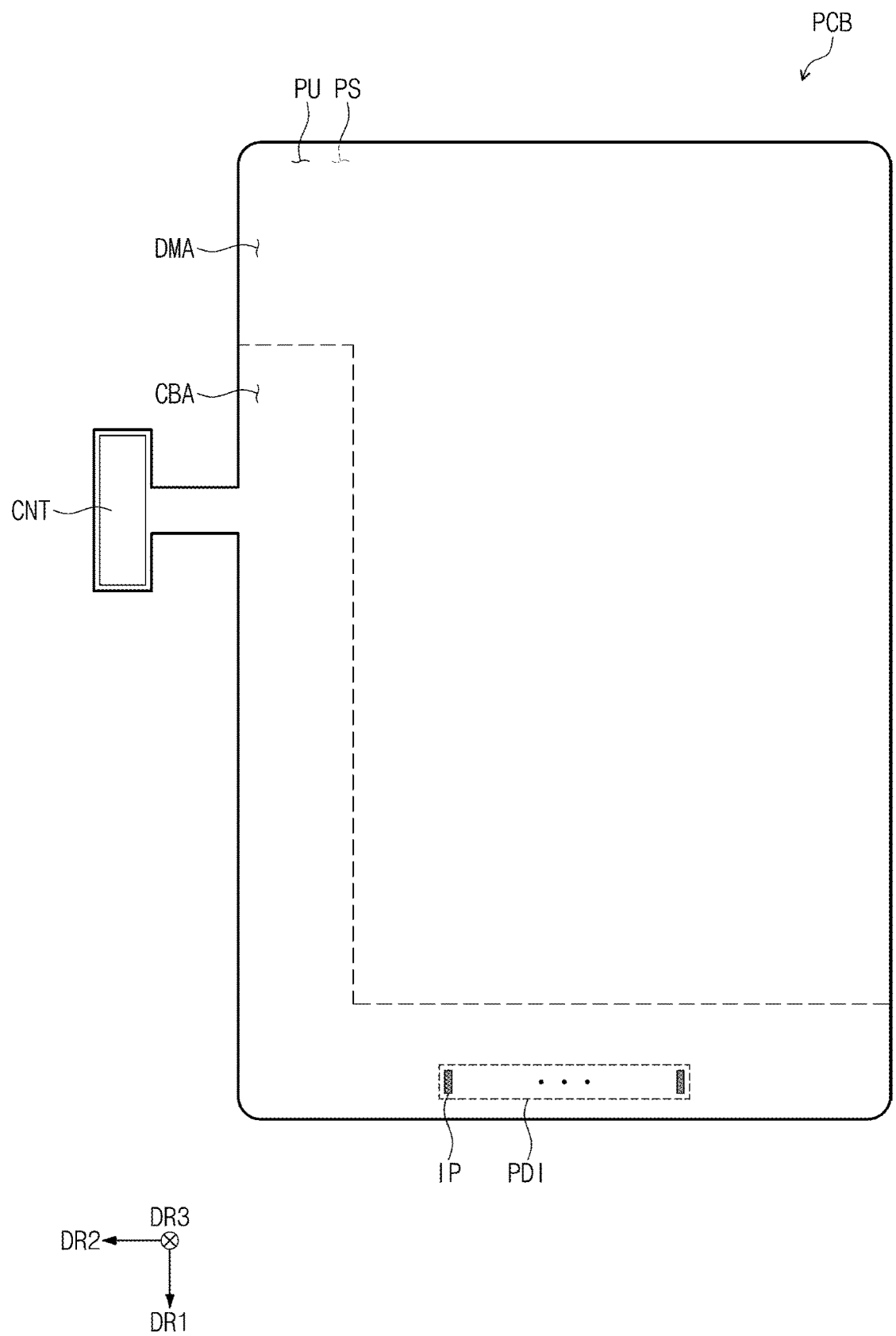
FIG. 7B is a rear view of a circuit board according to an exemplary embodiment.
Figure 8:
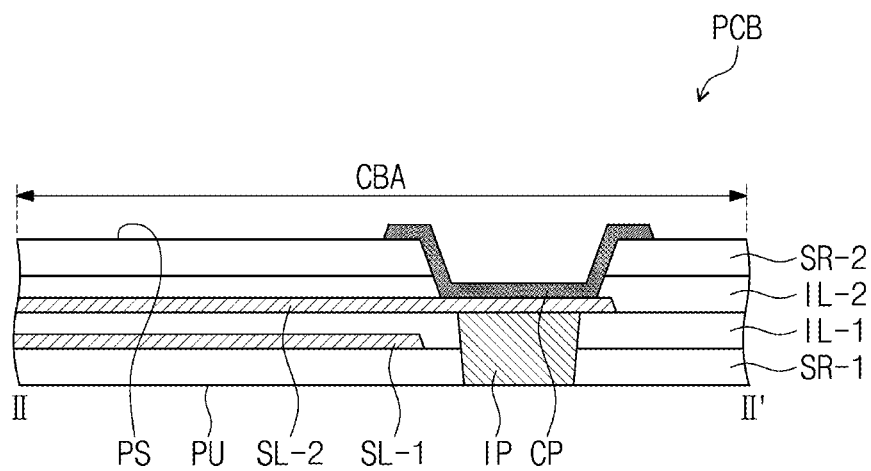
FIG. 8 is a cross-sectional view taken along line II-II' of FIG. 7A.

FIG. 7A is a plan view of a circuit board according to an exemplary embodiment. FIG. 7B is a rear view of a circuit board according to an exemplary embodiment. FIG. 8 is a cross-sectional view taken along line II-II' of FIG. 7A.

Referring to FIGS. 7A and 7B, the circuit board PCB according to the illustrated exemplary embodiment may be divided into a line area CBA and a dummy area DMA adjacent to the line area CBA. The circuit board PCB includes a front surface PS facing the rear surface IU of the display module DM, and a rear surface PU facing the front surface PS.

The line area CBA of the circuit board PCB may include substrate signal lines mounted on the circuit board PCB, first substrate pads CP disposed in the first substrate pad area PDC, and second substrate pads IP disposed in the second substrate pad area PDI.

The first substrate pads CP are disposed on the front surface PS and overlap the line area CBA. The first substrate pads CP may be connected to the display pads VP of the display module DM. The second substrate pads IP are disposed on the rear surface PU and overlap the line area CBA. The second substrate pads IP may be connected to the driving element D-IC.

In the illustrated exemplary embodiment, the circuit board PCB may further include a connector CNT protruding from the line area CBA in the second direction DR2. The connector CNT may be used as a test connector for checking whether the circuit board PCB operates in the process of assembling the display module DM. In addition, the connector CNT may be bent in a direction toward the rear surface PU to be connected to the electronic module EM, without being limited thereto.

The line area CBA according to the illustrated exemplary embodiment is shown to be provided on the right and bottom sides of the circuit board PCB, but the inventive concepts are not limited thereto. For example, the location of the line area CBA may be varied according to configurations the display module DM and the circuit board PCB in other exemplary embodiments.

Referring to FIG. 8, the circuit board PCB according to the illustrated exemplary embodiment may include a plurality of insulating layers. For example, the circuit board PCB may include a first solder resist layer SR-1, a first substrate insulating layer IL-1, a second substrate insulating layer IL-2, and a second solder resist layer SR-2, which are sequentially stacked.

The first substrate insulating layer IL-1 and the second substrate insulating layer IL-2 may include at least any one of polyimide, polyethylene naphthalate, polyethylene terephthalate, polyarylate, polycarbonate, polyetherimide, or polyethersulfone.

The circuit board PCB may include conductive pads disposed between a plurality of insulating layers. For example, the circuit board PCB may include a first substrate signal line SL-1 disposed on the first solder resist layer SR-1, and a second substrate signal line SL-2 insulated from the first substrate signal line SL-1 with the first substrate insulating layer IL-1 therebetween.

The circuit board PCB may include a first substrate pad CP and a second substrate pad IP. The first substrate pad CP may be disposed in a hole penetrating through the second solder resist layer SR-2 and the second substrate insulating layer IL-2 to expose a portion of the second substrate signal line SL-2 from the front surface PS. The second substrate pad IP may be disposed in a hole penetrating through the first solder resist layer SR-1 and the first substrate insulating layer IL-1 to expose a portion of the second substrate signal line SL-2 from the rear surface PU.

In the illustrated exemplary embodiment, the first substrate pad CP may overlap at least a portion of the second substrate pad IP.

The first substrate pad CP and the second substrate pad IP may be connected to opposing surfaces of the second substrate signal line SL-2 among the substrate signal lines SL-1 and SL-2.

FIG. 8 exemplarily illustrates the circuit board PCB as having two substrate insulating layers IL-1 and IL-2 and two substrate signal lines SL-1 and SL-2, but the inventive concepts are not limited thereto. For example, in some exemplary embodiments, the circuit board PCB may include two or more substrate insulating layers and substrate signal lines.

In addition, in some exemplary embodiments, the circuit board PCB may further include a bridge pattern penetrating the substrate insulating layers IL-1 and IL-2 to connect the signal lines SL-1 and SL-2 disposed on different layers.

Figure 9:
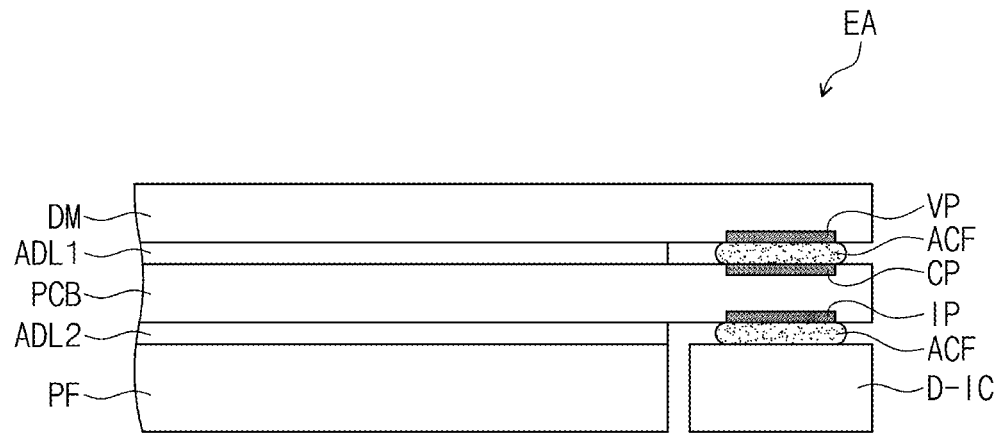
FIG. 9 is a cross-sectional view of some components of an electronic apparatus according to an exemplary embodiment.
Figure 9:
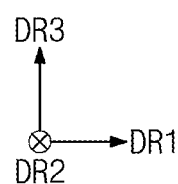

FIG. 9 is a cross-sectional view of some components of an electronic apparatus according to an exemplary embodiment.

Referring to FIG. 9, the display pad VP of the display module DM and the first substrate pad CP of the circuit board PCB may be connected through a conductive adhesive member ACF. In addition, the driving element D-IC and the second substrate pad IP of the circuit board PCB may be connected through an conductive adhesive member ACF. The conductive adhesive member may include an anisotropic conductive adhesive film (ACF).

In regions other than the region, in which the display pad VP and the first substrate pad CP are connected through the conductive adhesive member ACF, the display module DM and the circuit board PCB may be connected through a first adhesive layer ADL1. In addition, in regions other than the region in which the driving element D-IC and the second substrate pad IP are connected through the conductive adhesive member ACF, the circuit board PCB and the protective film PF may be connected through a second adhesive layer ADL2.

In the illustrated exemplary embodiment, the first substrate pad CP may overlap at least a portion of the second substrate pad IP.

The first adhesive layer ADL1 and the second adhesive layer ADL2 may each include at least one of a pressure sensitive adhesive (PSA), an optical clear adhesive (OCA), and an optical clear resin (OCR), without being limited thereto.

According to an exemplary embodiment, the circuit board PCB is disposed between the display module DM and the protective film. In this manner, a flexible circuit board that is bent from a display panel to be connected to a driving element may be obviated, and defects that may arise from bending the display panel DP, such as cracks in the signal lines, may be prevented or at least be suppressed.

In addition, obviating the bending process of the display panel DP during manufacture may simplify the process for manufacturing an electronic apparatus EA. In addition, since an insulating layer disposed inside the circuit board PCB may include any one of polyimide or polyethylene terephthalate (PET), impact resistance of the electronic apparatus EA may be improved.

Figure 10A:
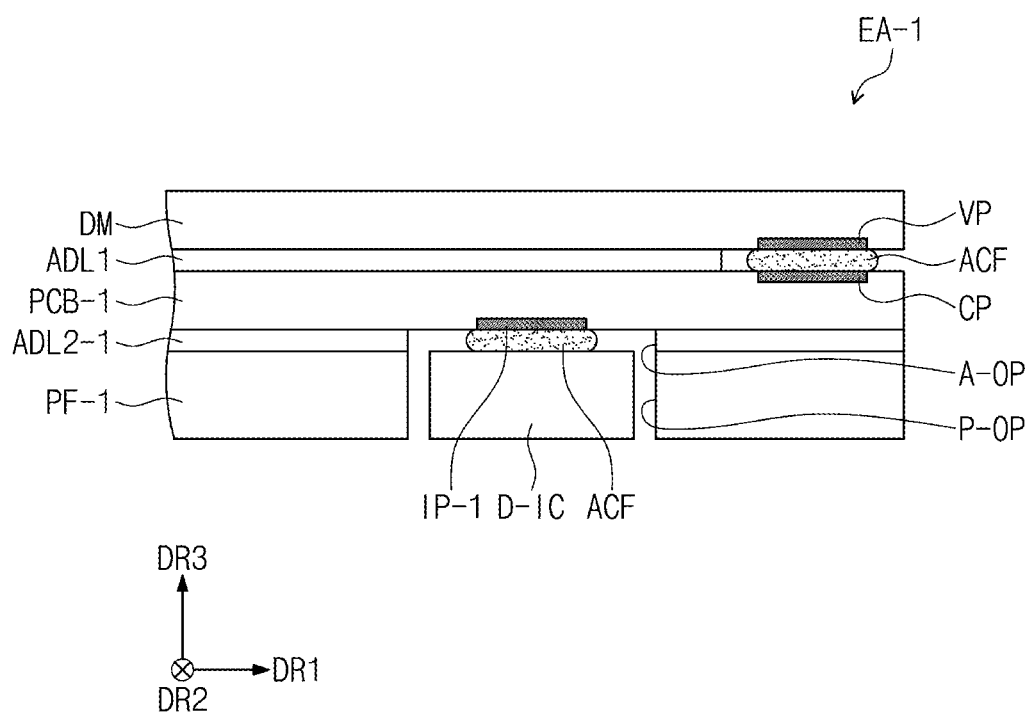
FIG. 10A is a cross-sectional view of some components of an electronic apparatus according to an exemplary embodiment.
Figure 10B:
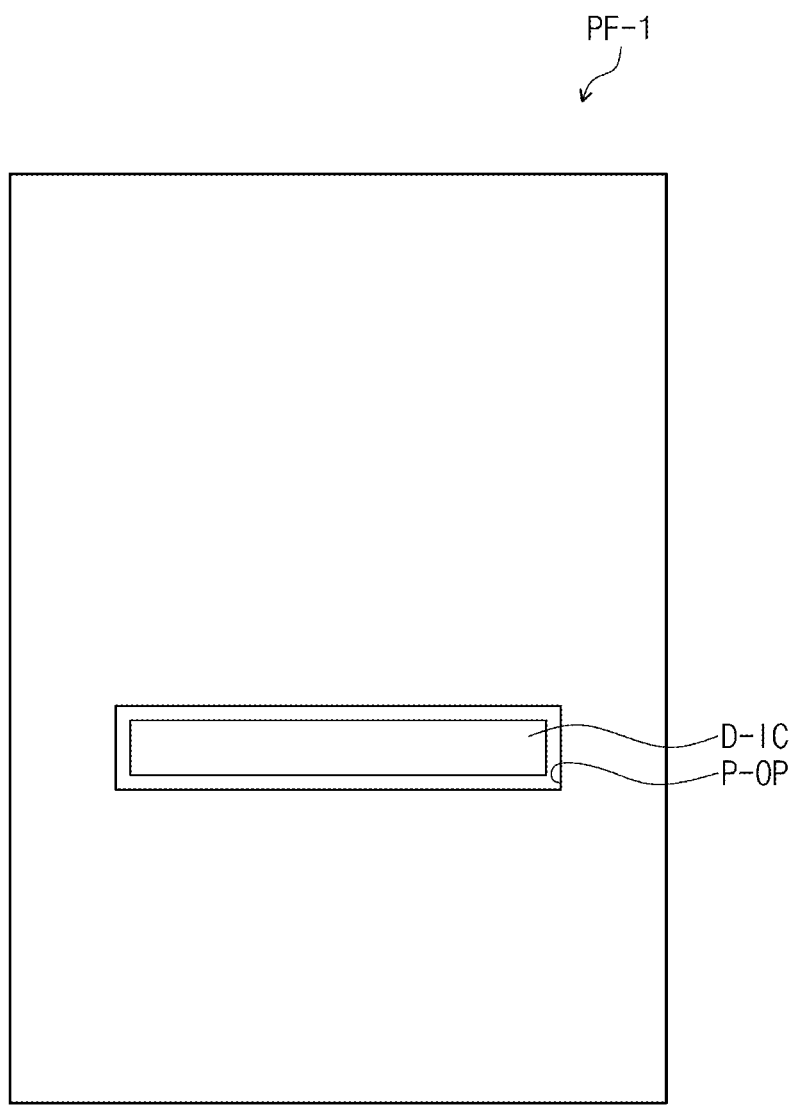
FIG. 10B is a plan view illustrating a protective film and a driving element according to an exemplary embodiment.

FIG. 10A is a cross-sectional view of some components of an electronic apparatus according to an exemplary embodiment. FIG. 10B is a plan view illustrating a protective film and a driving element according to an exemplary embodiment. The like/similar reference numerals are given for the like/similar components shown in FIG. 9, and thus, repeated descriptions thereof will be omitted. Hereinafter, an electronic apparatus EA-1 according to the illustrated exemplary embodiment will be described.

Referring to FIGS. 10A and 10B, the display pad VP of the display module DM and the first substrate pad CP of the circuit board PCB-1 according to the illustrated exemplary embodiment may be connected through a conductive adhesive member (ACF). In addition, the driving element D-IC and the second substrate pad IP-1 of the circuit board PCB-1 may be connected through the conductive adhesive member ACF. The conductive adhesive member may include an anisotropic conductive adhesive film (ACF).

In regions other than the region in which the display pad VP and the first substrate pad CP are connected through the conductive adhesive member ACF, the display module DM and the circuit board PCB-1 may be connected through the first adhesive layer is ADL1.

In addition, in regions other than the region in which the driving element D-IC and the second substrate pad IP-1 are connected through the conductive adhesive member ACF, the circuit board PCB-1 and the protective film PF-1 may be connected through the second adhesive layer ADL2-1.

In the illustrated exemplary embodiment, the first substrate pad CP may be spaced apart from the second substrate pad IP-1. Accordingly, the driving element D-IC may be connected to the substrate pad IP-1, which is exposed by a first hole A-OP of the second adhesive layer ADL2-1 and a second hole P-OP of the protective film PF-1. In this case, the driving element D-IC may be surrounded by the second adhesive layer ADL2-1 and the protective film PF-1.

Figure 11:
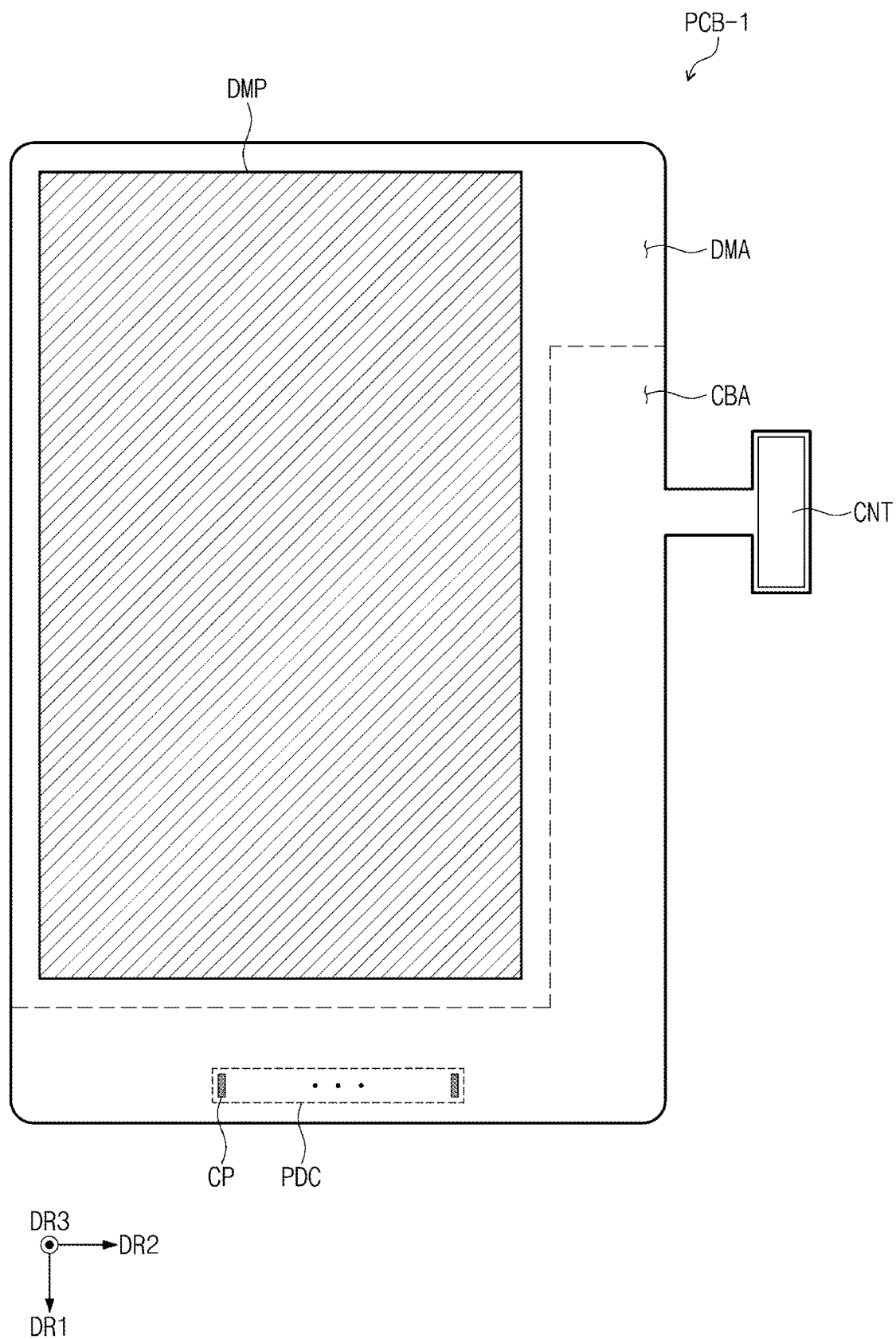
FIG. 11 is a plan view of a circuit board according to an exemplary embodiment.

FIG. 11 is a plan view of a circuit board according to an exemplary embodiment. The like/similar reference numerals are given for the like/similar components shown in FIGS. 7A and 7B, and thus, repeated descriptions thereof will be omitted.

A circuit board PCB-1 according to the illustrated exemplary embodiment may be divided into a line area CBA and a dummy area DMA adjacent to the line area CBA. The line area CBA may include the substrate pads VP disposed on the first substrate pad area PDC and the connector CNT protruding along the second direction DR2 from the line area CBA. The circuit board PCB-1 according to the illustrated exemplary embodiment may further include a metal pattern DMP disposed in the dummy area DMA.

The metal pattern DMP may have electromagnetic wave shielding or electromagnetic wave absorption properties. As the metal pattern DMP is embedded in the circuit board PCB-1, a functional layer including a metal plate among the protective films PF described in FIG. 2A may be omitted. Therefore, a slimmer electronic apparatus EA than an electronic apparatus having a separate metal plate disposed may be provided.

According to an exemplary embodiment, the circuit board PCB is disposed between a display module and a protective film. In this manner, a flexible circuit board that is bent from a display panel to be connected to a driving element may be obviates, and defects that may arise from bending the display panel, such as cracks in the signal lines, may be prevented or at least be suppressed.

In addition, obviating the bending process of the display panel DP during manufacture may simplify the process for manufacturing an electronic apparatus EA. In addition, since an insulating layer disposed inside a circuit board includes any one of polyimide or polyethylene terephthalate (PET), impact resistance of the electronic apparatus EA may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic apparatus comprising:
a display module having a front surface and a rear surface opposing the front surface, the display module including pixels disposed on the front surface and a display pad connected to the pixels and exposed from the rear surface;
a protective film disposed on the rear surface of the display module;
a circuit board disposed between the display module and the protective film and having a front surface facing the rear surface of the display module and a rear surface opposing the front surface of the circuit board, the circuit board including a first substrate pad connected to the display pad and exposed from the front surface of the circuit board and a second substrate pad exposed from the rear surface of the circuit board; and
a driving element connected to the second substrate pad to drive the pixels,
wherein the second substrate pad and the protective film are spaced apart from each other.

2. The electronic apparatus of claim 1, wherein the circuit board further comprises:
a first solder resist layer;
a plurality of substrate insulating layers disposed on the first solder resist layer and including at least one of polyimide and polyethylene terephthalate (PET);
a plurality of substrate signal lines disposed between the substrate insulating layers; and
a second solder resist layer covering the substrate insulating layers,
wherein the first substrate pad and the second substrate pad are connected to the same substrate signal line among the substrate signal lines.

3. The electronic apparatus of claim 1, wherein the first substrate pad overlaps at least a portion of the second substrate pad.

4. The electronic apparatus of claim 1, wherein:
the first substrate pad is spaced apart from the second substrate pad; and
the driving element is surrounded by the protective film.

5. The electronic apparatus of claim 4, wherein:
the protective film includes a through accommodation hole; and
the driving element is accommodated in the accommodation hole.

6. The electronic apparatus of claim 1, wherein the circuit board includes a line area in which the substrate signal lines are disposed, and a dummy area adjacent to the line area.

7. The electronic apparatus of claim 6, further comprising an electronic module disposed on a lower side of the protective film, and comprising at least one of an audio output module, a light emitting module, a light receiving module, and a camera module,
wherein the circuit board further comprises a connector connected to the electronic module.

8. The electronic apparatus of claim 6, wherein the circuit board further comprises a metal pattern disposed in the dummy area.

9. The electronic apparatus of claim 1, wherein the display module comprises:
a base substrate including a base layer including an organic material and a barrier layer including an inorganic material disposed on the base layer;
a transistor disposed on the base layer and including a semiconductor pattern having a plurality of electrodes;
an organic light emitting element connected to the transistor; and
a signal line connecting the transistor and the display pad, and
wherein the signal line is disposed on the same layer as at least one of the electrodes of the semiconductor pattern.

10. The electronic apparatus of claim 9, wherein:
the base substrate includes a substrate hole penetrating through the base layer and the barrier layer and exposing a portion of the signal line; and
the display pad comprises a conductive pattern filled in the substrate hole.

11. The electronic apparatus of claim 9, wherein:
the base substrate further comprises an additional barrier layer disposed on a lower side of the base layer, and an additional base layer disposed on a lower side of the additional barrier layer and including polyimide;
the substrate hole penetrates through the base layer, the barrier layer, the additional base layer, and the additional barrier layer and exposes a portion of the signal line; and
the display pad is formed of a metal filled in the substrate hole.

12. The electronic apparatus of claim 1, further comprising an adhesive layer disposed between the display module and the circuit board to bond the display module and the circuit board,
wherein the adhesive layer comprises at least one of a pressure sensitive adhesive (PSA), an optical clear adhesive (OCA), and an optical clear resin (OCR).

13. The electronic apparatus of claim 12, wherein the adhesive layer comprises an antistatic material.

14. The electronic apparatus of claim 1, wherein the display pad, the first substrate pad, the second substrate pad, and the driving element are connected through an anisotropic conductive film (ACF).

15. The electronic apparatus of claim 1, wherein the protective film comprises at least one of a light blocking layer, a heat dissipation layer, and a cushion layer.

16. The electronic apparatus of claim 1, wherein the circuit board covers the entire rear surface of the display module.

17. An electronic apparatus comprising:
a display module having a front surface and a rear surface opposing the front surface, the display module including pixels disposed on the front surface and a display pad connected to the pixels and exposed from the rear surface;
a circuit board having a front surface facing the rear surface of the display module and a rear surface opposing the front surface of the circuit board, the circuit board including a first substrate pad exposed from the front surface of the circuit board and a second substrate pad exposed from the rear surface of the circuit board; and
a driving element connected to the second substrate pad to drive the pixels,
wherein the circuit board covers substantially the entire rear surface of the display module.

18. The electronic apparatus of claim 17, wherein the circuit board further comprises:
- a first solder resist layer;
- a plurality of substrate insulating layers disposed on the first solder resist layer and including at least one of polyimide and polyethylene terephthalate (PET);
- a plurality of substrate signal lines disposed between the substrate insulating layers; and
- a second solder resist layer covering the substrate insulating layers, and
- wherein the first substrate pad and the second substrate pad are connected to the same substrate signal line among the substrate signal lines.

19. The electronic apparatus of claim 17, wherein the circuit board includes a line area in which the substrate signal lines are disposed, and a dummy area adjacent to the line area.

20. The electronic apparatus of claim 19, wherein the circuit board further comprises a metal pattern disposed in the dummy area.

21. The electronic apparatus of claim 17, wherein the display module comprises:
- a base substrate comprising a base layer including an organic material, and a barrier layer including an inorganic material disposed on the base layer;
- a transistor disposed on the base layer and including a semiconductor pattern having a plurality of electrodes;
- an organic light emitting element connected to the transistor; and
- a signal line connecting the transistor and the display pad, and
- wherein the signal line is disposed on the same layer as at least one of the electrodes of the semiconductor pattern.

22. The electronic apparatus of claim 21, wherein:
the base substrate includes a substrate hole penetrating through the base layer and the barrier layer and exposing a portion of the signal line; and
the display pad comprises a conductive pattern filled in the substrate hole.

23. The electronic apparatus of claim 22, wherein:
the base substrate further comprises an additional barrier layer disposed on a lower side of the base layer, and an additional base layer disposed on a lower side of the additional barrier layer and including polyimide;
the substrate hole penetrates through the base layer, the barrier layer, the additional base layer, and the additional barrier layer and exposes a portion of the signal line; and
the display pad is formed of a metal filled in the substrate hole.

24. The electronic apparatus of claim 17, further comprising a protective film disposed on a lower side of the display module, and including at least one of a light blocking layer, a heat dissipation layer, and a cushion layer.

* * * * *